United States Patent [19]
Lee

[11] Patent Number: 6,152,755
[45] Date of Patent: Nov. 28, 2000

[54] DEVICE FOR LOADING/UNLOADING MODULAR IC TO/FROM SOCKET IN MODULAR IC HANDLER

[75] Inventor: Sang Soo Lee, Chonan, Rep. of Korea

[73] Assignee: Mirae Corporation, Chungcheongnam-do, Rep. of Korea

[21] Appl. No.: 09/210,191

[22] Filed: Dec. 11, 1998

[30] Foreign Application Priority Data

Jan. 20, 1998 [KR] Rep. of Korea ......................... 98-1519

[51] Int. Cl.[7] ....................................................... G01R 1/04
[52] U.S. Cl. ........................ 439/327; 324/158.1; 439/158
[58] Field of Search ................................... 439/325, 160, 439/327, 158; 324/73.1, 158.1

[56] References Cited

U.S. PATENT DOCUMENTS

| | | | |
|---|---|---|---|
| 5,528,161 | 6/1996 | Liken et al. | 324/158.1 |
| 5,614,819 | 3/1997 | Nucci | 324/158.1 |
| 5,667,351 | 9/1997 | Tokairin et al. | 414/225 |

*Primary Examiner*—Neil Abrams
*Attorney, Agent, or Firm*—Sheridan Ross P.C.

[57] ABSTRACT

Device for loading/unloading a modular IC (1) to/from a socket in a modular IC handler which facilitates an automatic, quick, and accurate loading/unloading of a modular IC to be tested to/from a socket, including a base plate, sliders (12) mounted at opposite sides of the base plate for moving in forward or backward directions, at least one socket base (16) between the sliders, a socket (17) fixed to each of the socket bases for inserting a modular IC thereto, a pusher (25) each fitted to the slider to move in up and down directions for inserting the modular IC transported thereto by a known pick up means (20) into the socket, and a take out means (31,32,33) for removing the modular IC inserted in the socket.

10 Claims, 10 Drawing Sheets

DEVICE FOR LOADING/UNLOADING MODULAR IC TO/FROM SOCKET IN MODULAR IC HANDLER

BACKGROUND OF THE INVENTION

1. Field of the Invention

The present invention relates to a modular IC, and more particularly, to a device for loading/unloading a modular IC to/from a socket in a modular IC handler which facilitates an automatic, quick, and accurate loading/unloading of a modular IC to be tested to/from a socket.

2. Background of the Related Art

The modular IC 1 is a unit circuit having a substrate 2 with a plurality of IC's and components 3 soldered on one or both sides thereof for mounting on a main board to extend a capacity or a function. As the modular IC 1 has a higher price than pieces of individual completed IC's, IC makers develop the modular IC as a major product. Since a reliability of the modular IC is important as much as the price of the modular IC expensive, only products determined good through strict quality control are forwarded and products determined not good are repaired or abandoned. Since there has been no device which automatically loads a completed modular IC 1 into a socket, conducts a test, automatically classifies the modular IC according to a result of the test, and unloading the modular IC into a cassette, a working efficiency of the modular IC test is low and has a low productivity due to monotonous work because a worker should pick up the modular IC's to be tested from a cassette one by one and load into a socket, conducts a test, classifies according to a result of the test, and place into an unloading test. Accordingly, the applicant filed Korean Patents in application Nos. 96-11590 and 96-11591 and Korea Utility Model in application No. 96-8320, on handlers which holds a completed modular IC placed in a cassette by means of a pick-up means, automatically loads into a socket, conducts a test, automatically classifies and unloads into an empty cassette according to a result of the test.

FIG. 2 illustrates a plan view of a modular IC handler shown in Patent application No. 96-11590 filed by the applicant, and FIG. 3 illustrates a section across line A—A in FIG. 2.

Referring to FIGS. 2 and 3, there is one pair of sliders on a base 4 adapted to move closer or away and a printed circuit board 7 having a plurality of oppositely fixed contact pins 6 on the slider. The sliders are provided as many as the modular IC's 1 to be tested. And, there are a cam plate 8 having a plurality of inwardly sloped cam slots 8a fitted movably along a straight line on each side of the slider, and there are bearings 9 at both ends of the slider for insertion into the cam slots 8a in the cam plate. Therefore, the modular IC can be loaded when the modular IC 1 is picked up by means of a pick up means, brought right over the slider 5, and lowered to position the modular IC between the sliders in a state the cam plate is moved backward with the one pair of sliders moved away and the guider 10 moved backward, i.e., in an initial state. After the modular IC 1 is loaded between the sliders 5, the holding of the pick up means is released, and the pick up means is elevated, the guiders 10 are moved forward to support the modular IC 1 by both sides thereof, and each of the cam plates 8 is moved forward. When the cam plates 8 advance inwardly, the sliders 5 spaced apart move closer because bearings 9 fixed to the sliders 5 are inserted in the cam slots 8a. Consequently, the printed circuit board 7 fixed to the sliders 5 moves toward the modular IC 1 to bring the contact pins 6 into contact with a pattern 1a of the modular IC making electrically conductive between them, thereby facilitating a test. Upon completion of a test of the modular IC by the aforementioned operation, in a reverse order of the aforementioned operation, the pick up means is lowered, and the test completed modular IC 1 is unloaded from between the sliders 5.

However, though the aforementioned related art device is advantageous in that a completed modular IC can be automatically loaded, tested, and classified into good or defective products according to a result of the test, the related art device has a problem in that an hourly productivity of the expensive handler is low because a cycle time of moving closer and away of the sliders 5 to which the printed circuit board fixed by moving the cam plates 8 forward and backward directions by means of a cylinder required for bringing the pattern 1a of the modular IC to the pins 6 to make them electrically conductive takes long.

And, even though frequent replacement of broken pins 6 is required, which pins 6 are fixed to the printed circuit board 7 and brought into contact with the pattern 1a of the modular IC, but is vulnerable to breakage as they are very weak, the replacement of the pins 6 is not fast because the sliders 5 should be separated from the base 4 beforehand.

SUMMARY OF THE INVENTION

Accordingly, the present invention is directed to a device for loading/unloading a modular IC to/from a socket in a modular IC handler that substantially obviates one or more of the problems due to limitations and disadvantages of the related art.

An object of the present invention is to provide a device for loading/unloading a modular IC to/from a socket in a modular IC handler, which can minimize a time required for loading/unloading a modular IC.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the device for loading/unloading a modular IC to/from a socket in a modular IC handler includes a base plate, sliders mounted at opposite sides of the base plate for moving in forward or backward, at least one socket base between the sliders, a socket fixed to each of the socket bases for inserting a modular IC thereto, a pusher each fitted to the slider to move in up and down directions for inserting the modular IC transported thereto by a known pick up means into the socket, and a take out means for taking out the modular IC inserted in the socket.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIGS. 5a~5e illustrate sections for explaining the operation of the device of the present invention, wherein, FIG. 5a illustrates a modular IC to be tested held by a pick up means at right over a socket;

FIG. 5b illustrates a modular IC placed on a socket by a pick up means,

FIG. 5c illustrates re-positioning of a modular IC by advancing an aligner,

FIG. 5d illustrates testing of a modular IC after loading the modular IC in a socket by lowering a pusher, and FIG. 5e illustrates a state a take out lever takes out a modular IC loaded in a socket in a state the pick up means is lowered; and, FIG. 6 illustrates a section of a socket applied to the device of the present invention.

DETAILED DESCRIPTION OF THE PREFERRED EMBODIMENT

Figure 1:
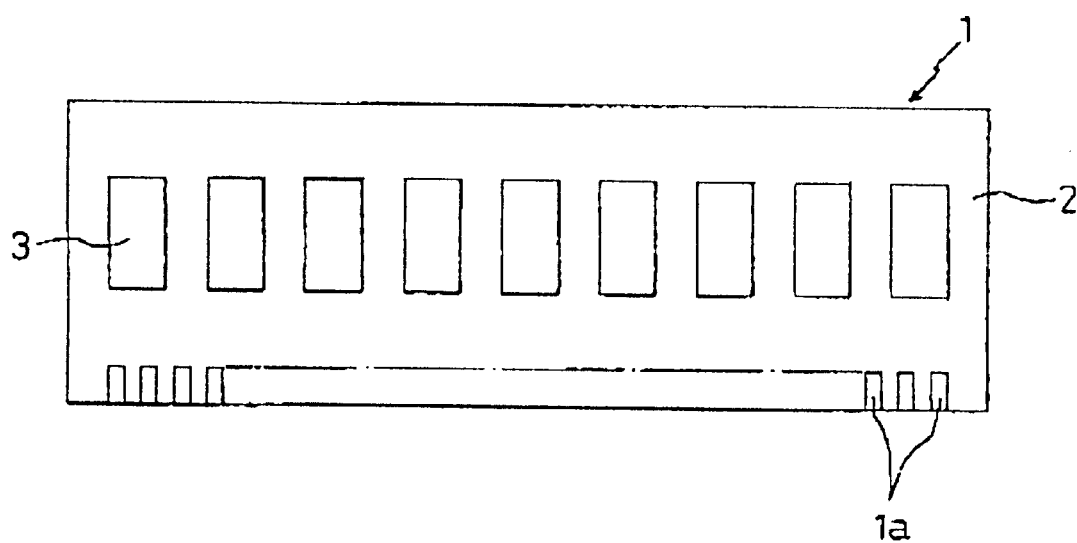
FIG. 1 illustrates a front view of a related art modular IC.
Figure 2:
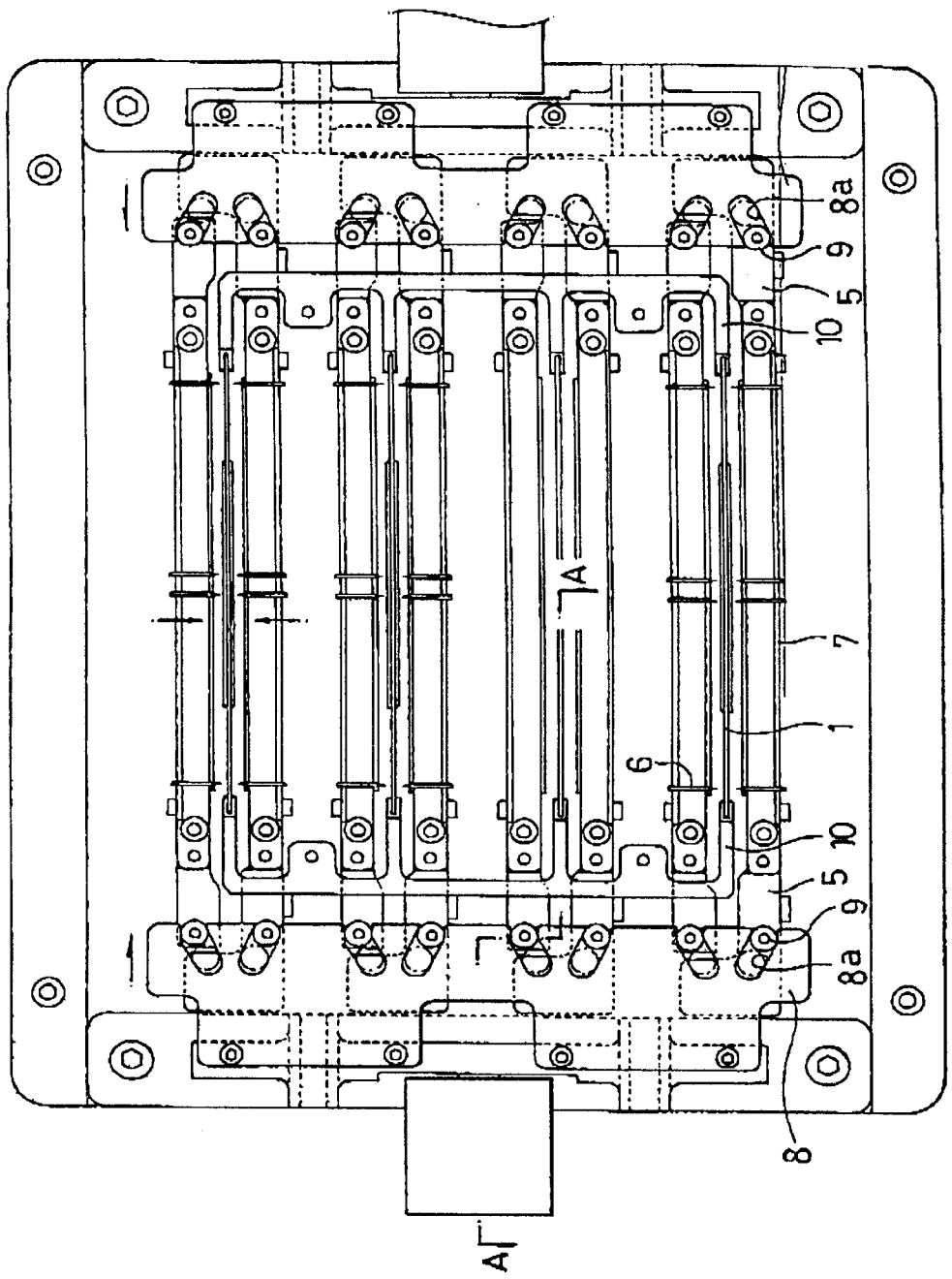
FIG. 2 illustrates a plan view of a related art modular IC handler.
Figure 3:
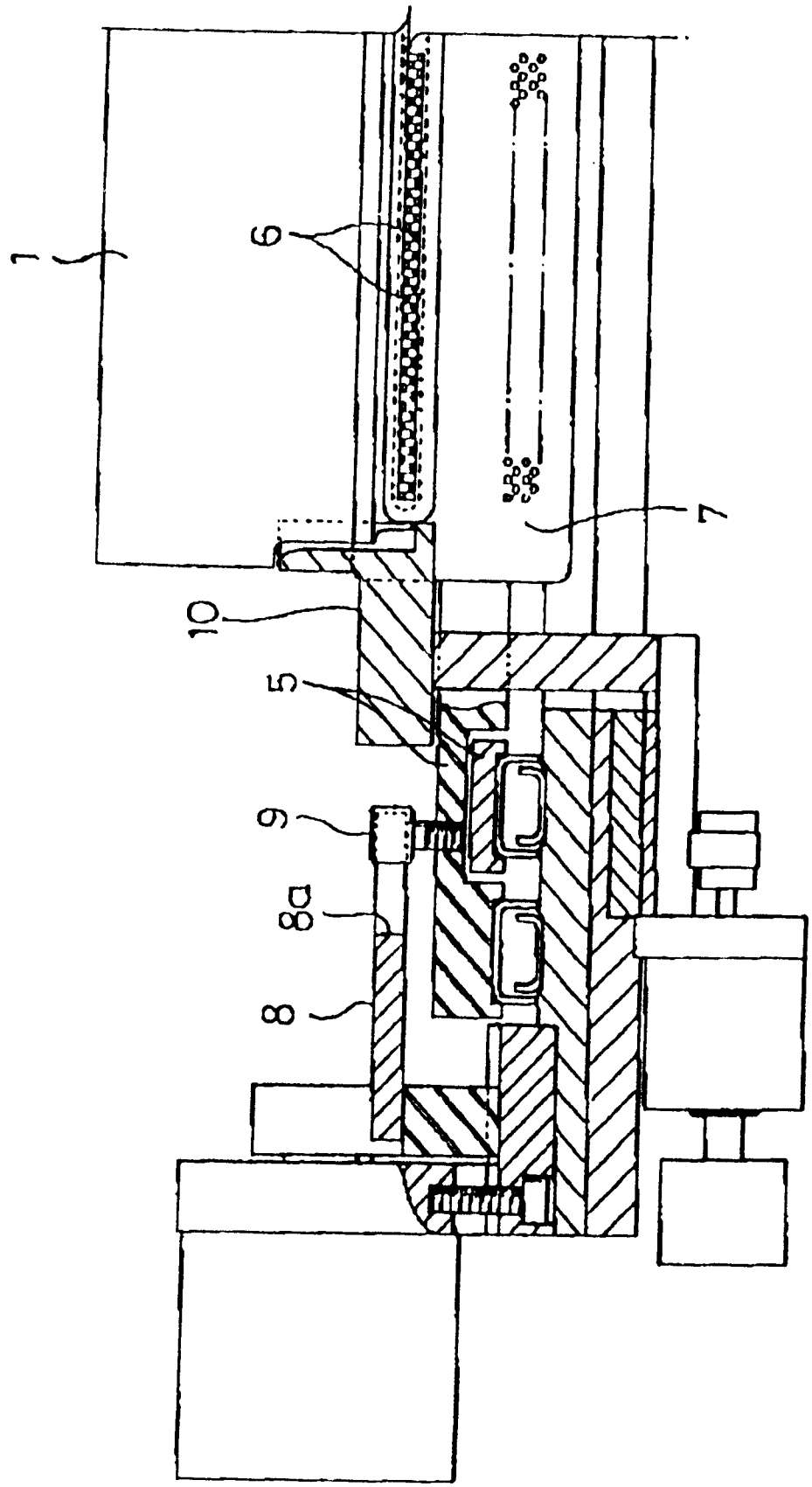
FIG. 3 illustrates a section across line A—A in FIG. 2.
Figure 4:
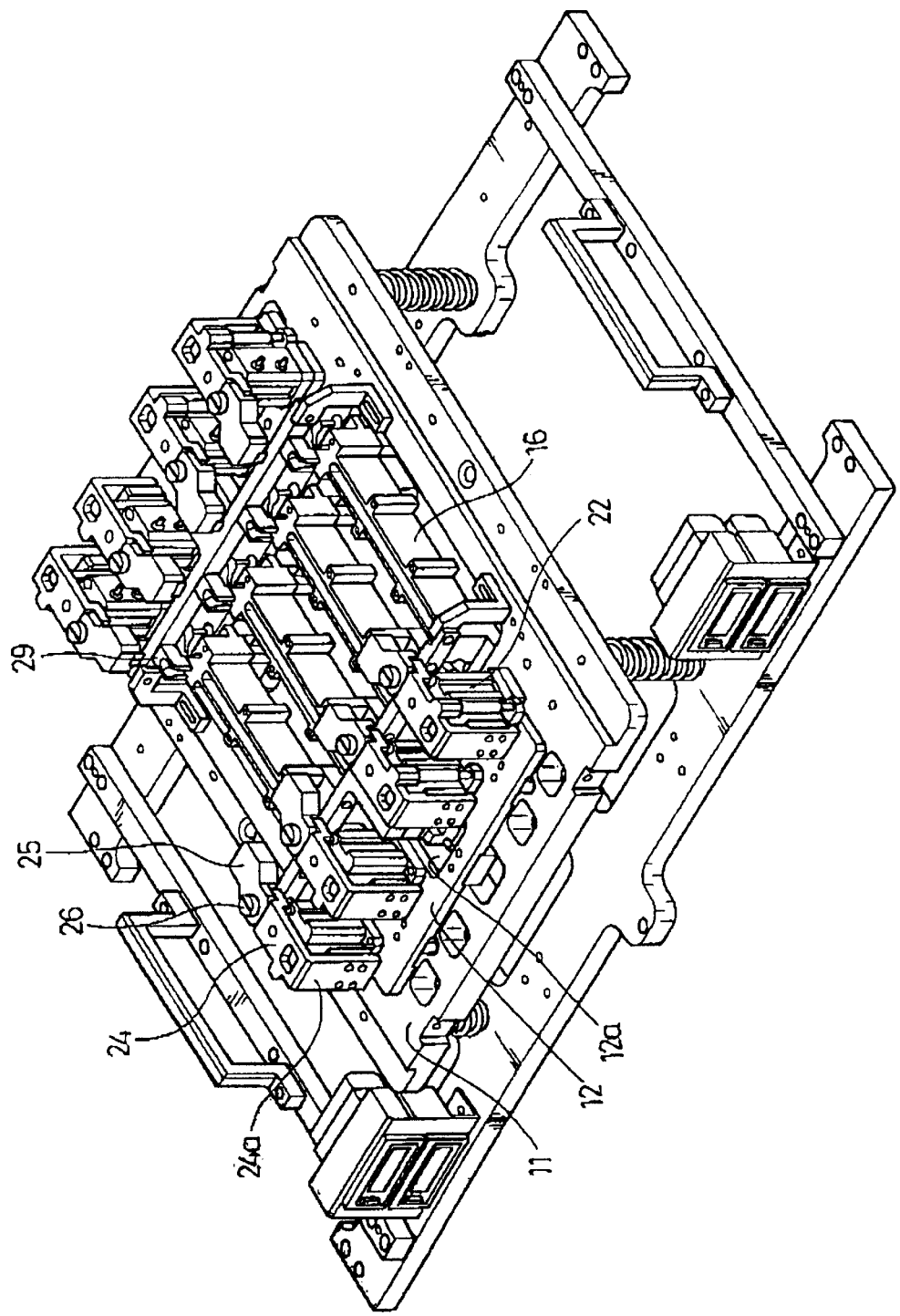
FIG. 4 illustrates a perspective view of key parts of a device for loading/unloading a modular IC to/from a socket in accordance with a preferred embodiment of the present invention.

Reference will now be made in detail to the preferred embodiments of the present invention, examples of which are illustrated in the accompanying drawings. FIG. 4 illustrates a perspective view of key parts of a device for loading/unloading a modular IC to/from a socket in accordance with a preferred embodiment of the present invention, FIGS. 5a~5e illustrate sections for explaining the operation of the device of the present invention, and FIG. 6 illustrates a section of a socket applied to the device of the present invention.

In the device for loading/unloading a modular IC to/from a socket in accordance with a preferred embodiment of the present invention, there is a slider 12 on both sides of a base plate 11 adapted to be movable forward or backward, so that the sliders 13 move on a straight line guided by an LM guide 15 as a main cylinder 13 fixed to a bottom of the base plate 11 and connected to the sliders 13 by a pin 14 is driven. There is at least one socket base 16 as shown in FIG. 6 between the opposite sliders 12 moving forward and backward on a straight line to which a socket 17 is fixed, for inserting a modular IC 1 to be tested. There is a terminal 18 of an "E" form in the socket 17 in match to the pattern and supported by pieces of natural rubber, for close electrical connection to a pattern 1a of the modular IC when the modular IC is inserted into the terminal 18. There is a pusher 25 fitted movable in up and down directions over the slider 12 for inserting the modular IC transported by a known pick up means 20 and placed on the socket 17, and a structure for the up and down direction movement will be explained in detail.

There are a forking cylinder 22 fixed to a bracket 23 over the slider 12 on a straight line to the socket 17 fitted between the sliders 12, a pusher bracket 24 fixed to a forking cylinder rod 22a, and a pusher 25 at a fore end of the pusher bracket for inserting the modular IC 1 placed on the socket 17 as the pusher 25 is lowered down following driving of the forking cylinder 22. The pusher 25 at a fore end of the pusher bracket 24 is replaceably fastened with a fastening screw 26, for replacing the pusher 25 according to a model of the modular IC intended to test because a height of the modular IC inserted into the socket 17 for test is different depending on models. And, there is guide means for a stable up and down movement of the pusher 25 following the operation of the forking cylinder 22. As the guide means, though a downward extension portion 24a may be formed on the pusher bracket 24, which is coupled to the bracket 23 by means of dovetail, the guide means adopted in the preferred embodiment of the present invention is an LM guide 27. There is align means in the vicinity of each slider 12 moving forward and backward following driving of the main cylinder 13 provided further for fixing a position of the modular IC placed on each socket 17, again. The align means has one align cylinder 28 mounted on the base plate 11, and an aligner 29 adapted to move forward and backward following a movement of the align cylinder for fixing a position of the modular IC placed on the socket 17, again. The aligners 29 each fixed to the align cylinder 28 are provided as many as the sockets 17, for making movement following a movement of one align cylinder 28. Though the align cylinder 28 is mounted on the base plate 11 and adapted to make forward and backward movement according to a movement of the LM guide 30, the forward and backward movement is not interfered even though the LM guide 30 is fitted for guiding the align cylinder 28 on the base plate 11 because the slider 12 has a cut-away portion 12a in a center portion of the slider 12 in a direction the slider advances. In the meantime, there is take-out means on both sides of the socket 17 for taking out the modular IC from the socket 17 upon completion of the test of modular IC. The take out means has one pair of take out cylinders 31 fixed to the base plate 11 and a take out lever 32 rotatably coupled to a rod 31a on the take out cylinder and having a fore end positioned in the socket 17. It is preferable that a link 33 with a long slot 33a is hinge coupled to the rod 31a on the take out cylinder 31 and one end of the take out lever 32 which is adapted to rotate centered on the pin 34 fixed to the socket is inserted in the long slot, for preventing a bottom of the modular IC from hitting the take-out lever 32 and being broken when the modular IC is inserted in advance. A bearing 35 is fitted to the one end of the take out lever 32 to which one end of the long slot 33a of the line 33 is inserted to dispose the bearing within the long slot 33a, for a smooth transmission of a force from the take out cylinder 31 to the take out lever 32.

The operation of the device for loading/unloading a modular IC to/from a socket in a modular IC handler will be explained.

Figure 5A:
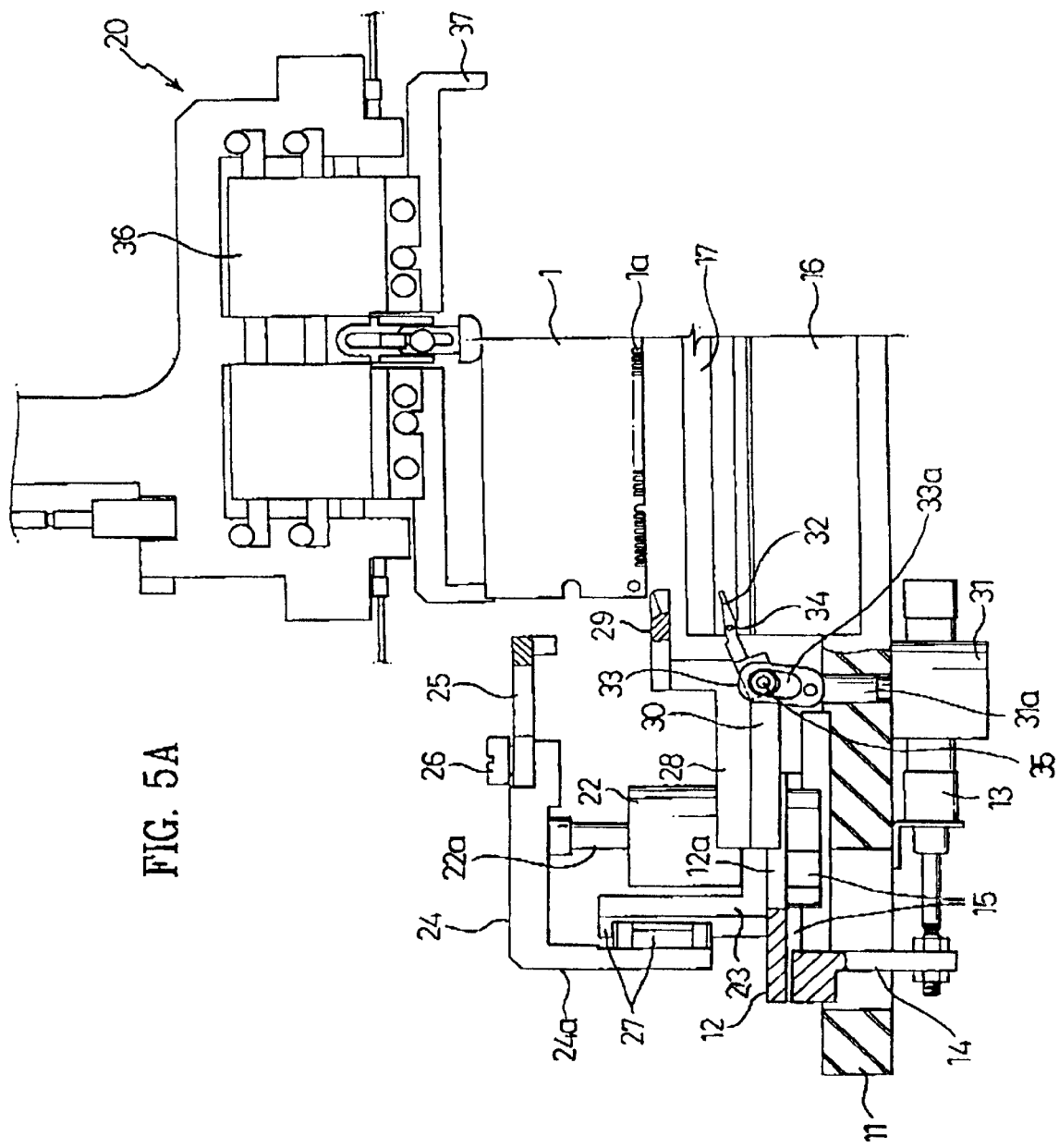
Figure 5B:
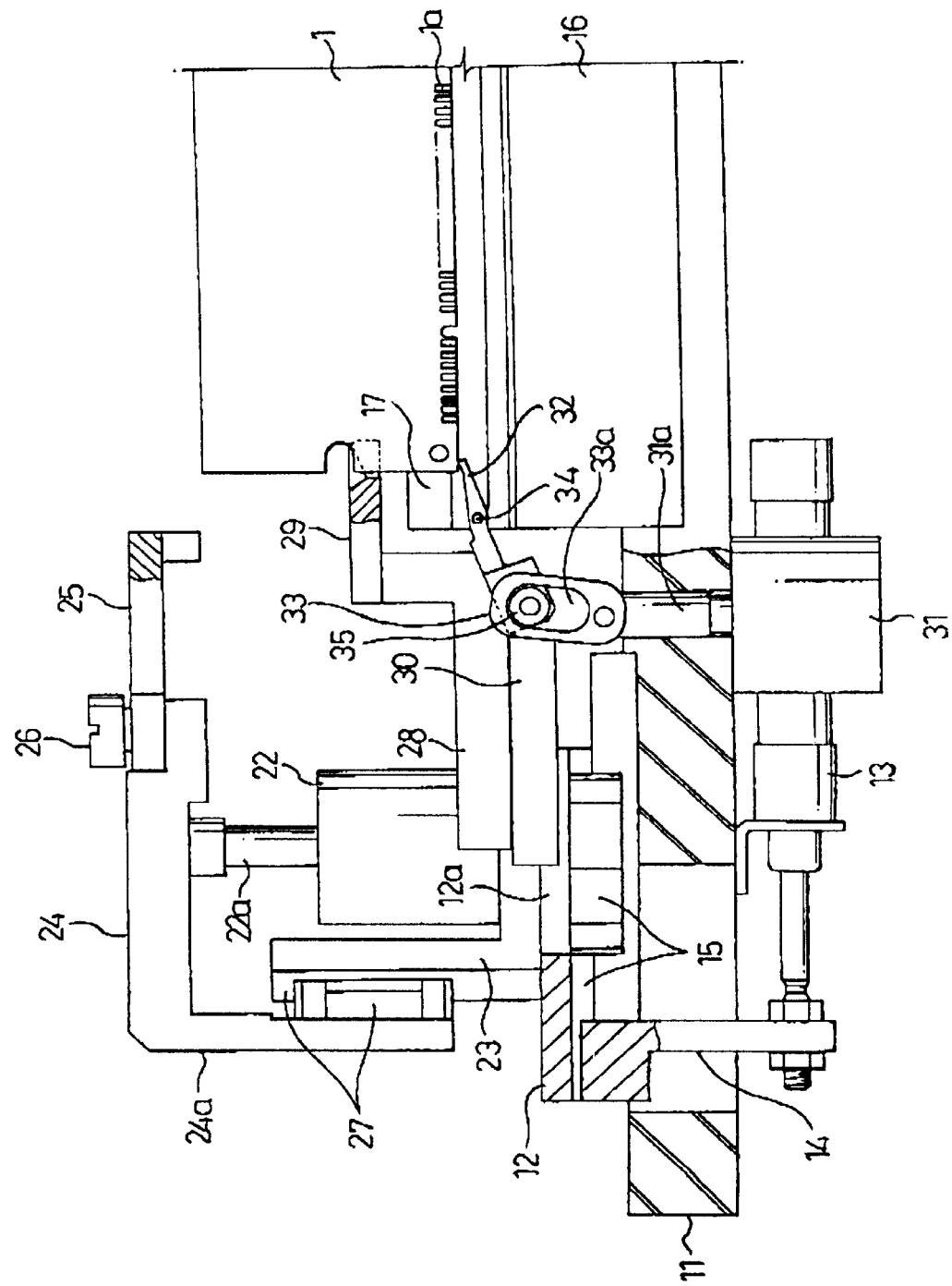
Figure 5C:
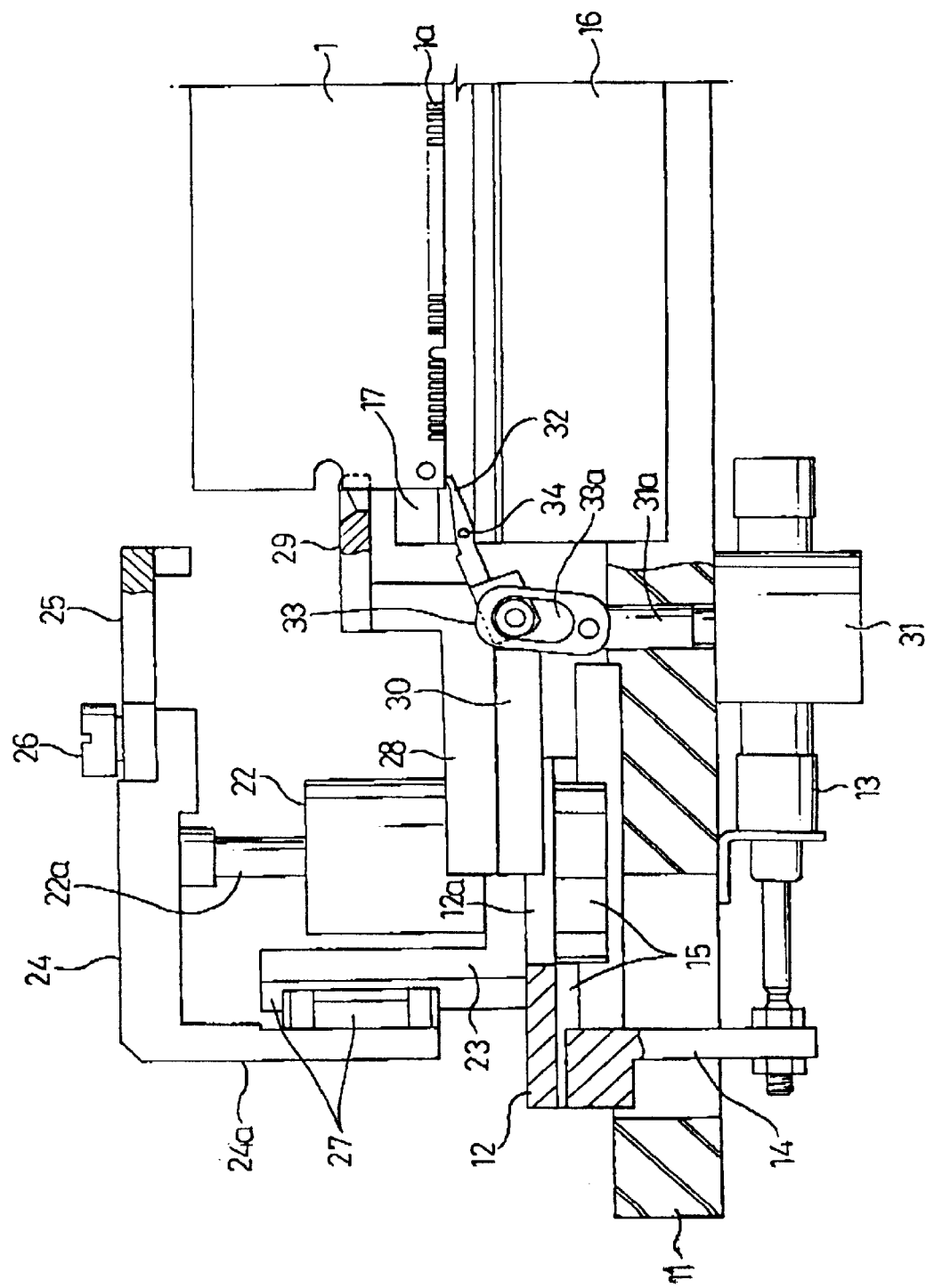
Figure 5D:
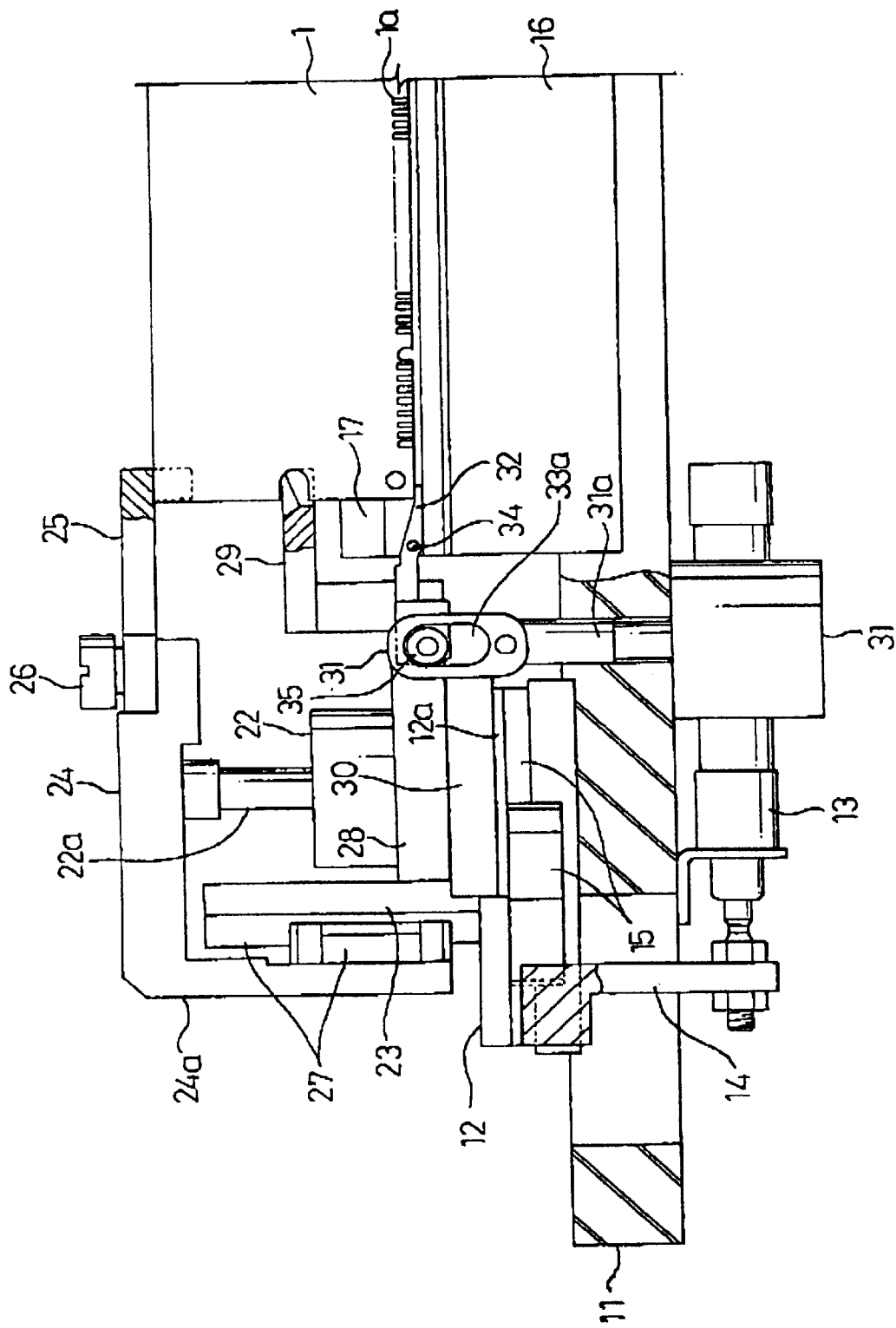
Figure 5E:
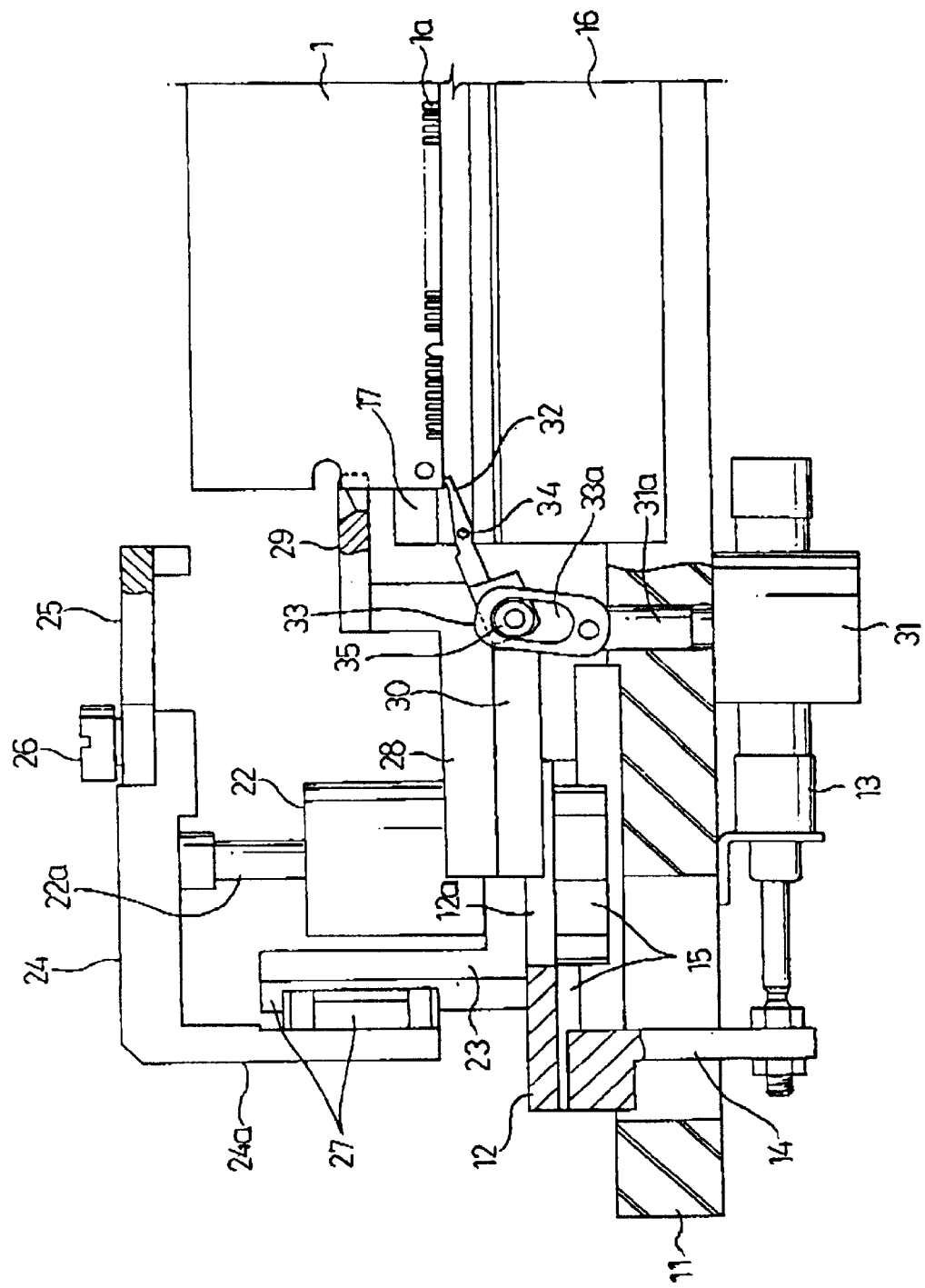
Figure 6:
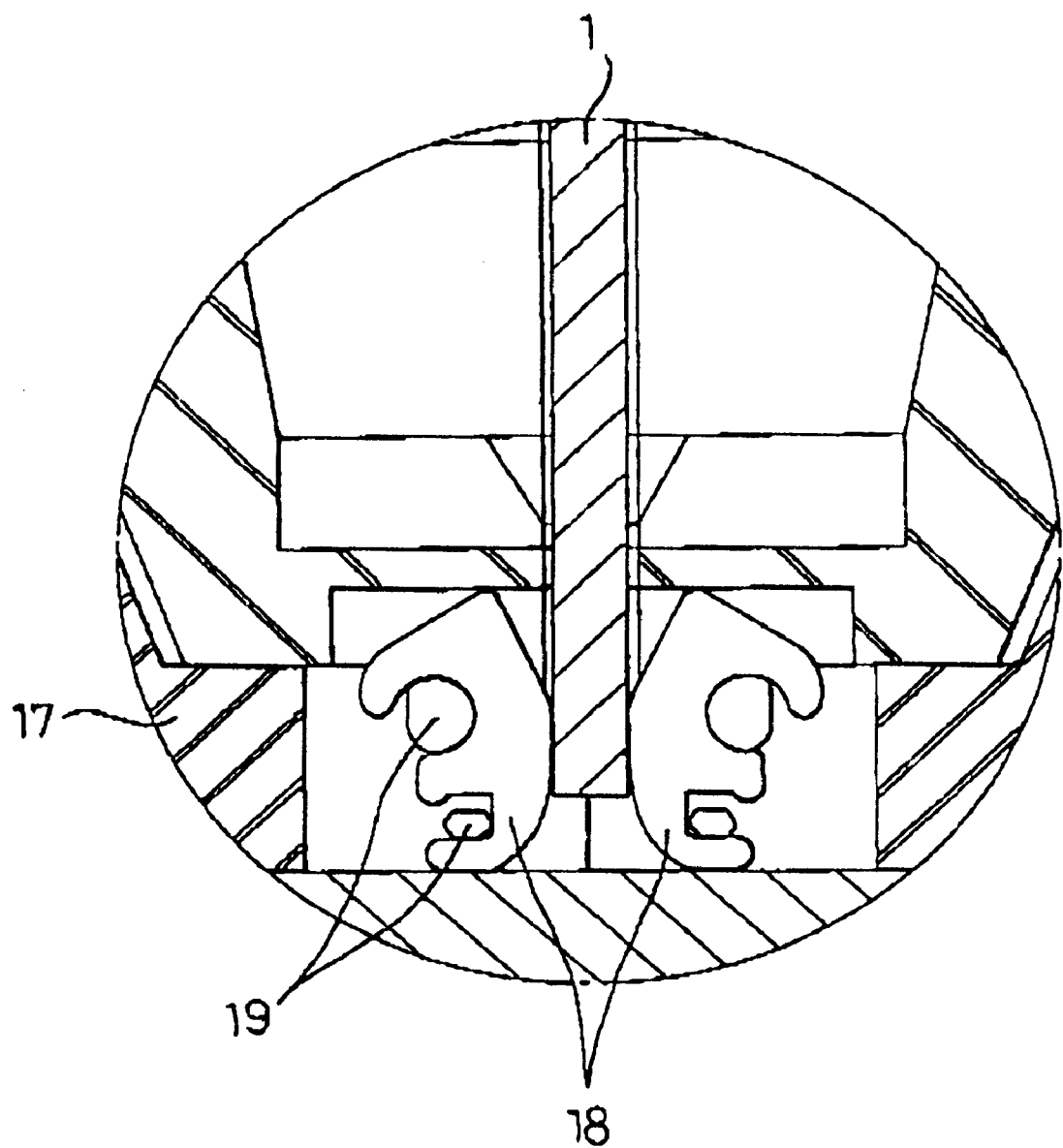

Referring to FIG. 5a, when the pick up means 20 holds, and transports at least one modular IC 1 intended to test to a position right over the socket 17 between the sliders 12, a control means(not shown) stops the transportation of the pick up means. As the one pair of sliders 12 and the aligners 29 are set back to opposite sides in the state when the pick up means 20 holding the modular IC 1 to be tested is right over the socket 17, the modular IC 1 can be loaded in the socket 17. And, even if the rod 31a on the take out cylinder 31 is disposed at a top dead center, the take out lever 32 is rotated centered on the pin 34 by its own weight, to stay at a lifted state. Under this state, as shown in FIG. 5b, the modular IC can be placed on the socket 17 when the pick up means 20 is lowered and fingers 37 gripping the modular IC 1 by both sides thereof are opened to release the modular IC. The modular IC might sometimes be placed on top of the socket 17, not horizontally, but tilted, due to defective positioning or foreign matters at an entrance of the socket 17 coming from fabrication and assembly errors of the pick up means and the like. If the modular IC placed on the socket 17 is pressed down as the pusher lowered down under this state, i.e., the modular IC is not exactly placed on the socket 17, the modular IC pattern 1a can not be brought into contact with the terminal 18 of the socket 17 and may be broken due to pressure from the pusher. Therefore, in the device of the present invention, an operation for re-positioning the modular IC is conducted after the modular IC 1 is placed on the socket 17 taking the problems into consideration. That is, the opposite align cylinders 28 are driven to move the aligners 29 toward the modular IC 1 so that fore ends of the aligners 29 are inserted between both sides of the modular IC, holding the modular IC at an exact position, the position of the modular IC can be corrected as shown in FIG. 5c even if the modular IC 1 is placed on the socket 17 tilted. After the modular IC 1 is thus placed on the socket 17 exactly, the modular IC should be loaded on the socket for making an electric connection to a tester, for conduction of test. When the main cylinder 13 is operated to move the sliders 12 toward the socket 17 in a state the modular IC 1 is placed on the socket 17, the rod 22a on the forking cylinder 22 is positioned at a top dead point so that the pusher 25 causes no interference with the modular IC 1. Therefore, when the sliders 12 move inwardly (toward the socket) as the main cylinder 13 connected to the sliders 12 with a connection pin 14 is driven, a bottom surface of the fore end of each pusher 25 is brought to a position over a top of the modular IC. Even though the sliders 12 move inwardly, the sliders 12 make no interference with the aligners 29 as the cut away portion 12a is formed in a center portion of the sliders. After sliders 12 are moved inwardly to position the fore ends of the pushers 25 over both side tops of the modular IC by driving the main cylinder 13, the forking cylinders 22 are driven to lower the pushers 25 from the top dead point, so that the bottom surface of each of the pushers presses down an end of the modular IC. According to this, the modular IC 1 placed on the socket 17 is completely loaded in the socket as shown in FIG. 5d such that the pattern 1a on both sides of the substrate of the modular IC 1 is brought into close contact with the terminal 18 elastically by the pieces natural rubber 19. Because the take out lever 32 rotated centered on the pin 34 along the long slot 33a in the link 33 by its own weight maintains a horizontal position by an inserting force of the modular IC when the modular IC is loaded in the socket 17 even if the rod 31a on the take out cylinder 31 is positioned at its top dead point, breakage at both sides of the substrate of the modular IC 1 when the take out lever hits the substrate during loading the modular IC can be prevented in advance. According to this operation, the bearing is brought into contact with a top end of the long slot 33a. And, as a stable lowering of the pusher bracket 24 can be made guided by the LM guide 27 in the aforementioned operation, the pusher 25 can press down a center portion of the modular IC more accurately. Since the modular IC's 1 loaded on the sockets 17 have different heights (800, 1000, 1200, 1500, 2000, and 2250 mil and etc.), the pusher 25 which loads the modular IC 1 to the socket 17 is also selected to suit to the modular IC 1 to be tested for inserting a variety of modular IC's into the socket 17 for testing. After the modular IC is loaded on the socket 17 according to the aforementioned operation, a performance of the modular IC is tested for a preset time period and a result of the test is informed to a CPU while the pusher 25 keeps pushing down the modular IC 1. After completion of the test of the modular IC loaded on the socket 17 for a preset time period, opposite to the aforementioned operation, the forking cylinder 22 is driven, to lift the pusher 25 which is pushing the modular IC 1 up to its top dead point and the main cylinder 13 is driven to open the sliders 12 to opposite sides. In the aforementioned operation, the align cylinders are also driven to restore the plurality of aligners 29 into initial states. After the restoration of the pushers 25 and the aligners 29 into initial states, the pick up means 20 is lowered from its top dead point down to its bottom dead point to standby for unloading the modular IC 1 loaded on the socket 17. Under this state, as the take out cylinder 31 is driven to pull down the hinge coupled rod 31a so that the take out lever 32 pressed down by the substrate of the modular IC to be kept at a horizontal position is rotated centered on the pin 34, pushing the modular IC 1 inserted in the socket 17 upward, a top of the modular IC is brought to a position between the fingers 37 of the pick up means 20 positioned at its bottom dead point. Then, the finger cylinder 36 is driven to move the spaced fingers 37 closer as shown in FIG. 5e, to unload the modular IC 1 pulled out from the socket 17 by the pick up means 20. After the modular IC inserted in the socket 17 is unloaded by the take out cylinder 31, the take out cylinder is driven again, to lift the rod 31a up to its top dead point, to wait for a new modular IC.

Though the explanation made up to now is on one cycle operation of one modular IC 17 test of loading on a socket 17, testing, unloading by the pick up means 20, it is apparent that the operation can be made continuously as far as the completed modular ICs are in the tray.

The device for loading/unloading a modular IC to/from a socket in a modular IC handler of the present invention has the following advantages over the related art device.

First, the direct insertion of a modular IC 1 between terminals 18 elastically supported by pieces of natural rubber 19, testing, and unloading by the take out lever 32 allows to minimize a cycle time, which facilitates an operation rate of the expensive equipment.

Second, since an endurance of the terminal is longer than the contact pin (POGO Pin) in the related art, a loss in management of the equipment is minimized.

Third, the re-positioning of the modular IC in the loading by the aligner 29 allows to prevent damage to the modular IC caused by defective loading in advance.

It will be apparent to those skilled in the art that various modifications and variations can be made in the device for loading/unloading a modular IC to/from a socket in a modular IC handler of the present invention without departing from the spirit or scope of the invention. Thus, it is intended that the present invention cover the modifications and variations of this invention provided they come within the scope of the appended claims and their equivalents.

What is claimed is:

1. A device for loading/unloading a modular IC to/from a socket in a modular IC handler comprising:
   a base plate;
   sliders mounted at opposite sides of the base plate for moving in forward or backward directions;
   at least one socket base between the sliders;
   a socket fixed to each of the socket bases for inserting a modular IC thereto;
   a pusher each fitted to the slider to move in up and down directions for inserting the modular IC transported thereto by a known pick up means into the socket; and,
   a take out means for removing the modular IC inserted in the socket.

2. A device as claimed in claim 1, wherein the slider has a plurality of forking cylinders fixed on an upper surface thereof and each of the forking cylinders has a rod fixed to a pusher bracket to which the pusher is fixed, thereby the pusher is facilitated to move in up and down directions following movements of the forking cylinder.

3. A device as claimed in claim 2, wherein the pusher is detachably fitted to the pusher bracket for changing the pusher according to a height of the modular IC to be tested.

4. A device as claimed in claim 2, wherein the pusher bracket is adapted to be guided by guide means in making up and down movements.

5. A device as claimed in claim 4, wherein the guide means is an LM guide fixed to the slider.

6. A device as claimed in claim 1, further comprising align means disposed between the sliders for re-positioning a position of the modular IC placed on the socket.

7. A device as claimed in claim 6, wherein the align means includes;

an align cylinder on the base plate, and an aligner adapted to move in forward and backward directions following movements of the align cylinder for re-positioning the position of the modular IC placed on the socket.

8. A device as claimed in claim 1, wherein the take out means includes;

one pair of take out cylinders fixed to the base plate, and a take out lever rotatably coupled to a rod on the take out cylinder and having a fore end disposed in the socket.

9. A device as claimed in claim 8, wherein the rod on the take out cylinder is hinge coupled to a link with a long slot to which one end of the take out lever is inserted for rotating centered on a pin fixed to the socket.

10. A device as claimed in claim 9, wherein a bearing is fitted to one end of the take out lever disposed in the long slot in the link.

* * * * *